United States Patent [19]

Holecek

[11] Patent Number: 5,045,799

[45] Date of Patent: Sep. 3, 1991

[54] PEAK TO AVERAGE POWER RATIO REDUCTION IN A POWER AMPLIFIER WITH MULTIPLE CARRIER INPUT

[75] Inventor: Charles L. Holecek, Marion, Iowa

[73] Assignee: Rockwell International Corporation, El Segundo, Calif.

[21] Appl. No.: 413,804

[22] Filed: Sep. 28, 1989

[51] Int. Cl.$^5$ .................. H03B 19/00; H03K 5/13
[52] U.S. Cl. ........................ 328/14; 328/15; 328/55; 328/155; 307/262; 307/511; 455/102
[58] Field of Search ............... 328/14, 15, 133, 155, 328/55, 109, 83, 117, 160; 307/262, 511, 513; 455/36, 165, 101, 102

[56] References Cited

U.S. PATENT DOCUMENTS

| | | | |
|---|---|---|---|
| 3,245,001 | 4/1966 | Barber | 331/52 |
| 3,300,726 | 1/1967 | Newman | 328/187 |
| 3,603,882 | 9/1971 | Wilson | 455/102 |
| 3,657,658 | 4/1972 | Kubo | 328/61 |
| 3,699,461 | 10/1972 | Huntsinger | 328/134 |
| 4,072,956 | 2/1978 | Provencher | 343/844 |
| 4,130,811 | 12/1978 | Katz et al. | 332/18 |
| 4,135,158 | 1/1979 | Parmet | 331/1 A |
| 4,504,791 | 3/1985 | Conway et al. | 328/15 |
| 4,558,282 | 12/1985 | Lowenschuss | 328/14 |
| 4,707,665 | 11/1987 | Nugent et al. | 455/165 |
| 4,924,188 | 5/1990 | Akazawa et al. | 328/155 |

Primary Examiner—Stanley D. Miller
Assistant Examiner—Richard Roseen
Attorney, Agent, or Firm—M. Lee Murrah; V. Lawrence Sewell; H. Fredrick Hamann

[57] ABSTRACT

The present invention is a method and apparatus for providing an output signal having a high average power and the method has the steps of providing a standard frequency; forming a plurality of input signals from the standard signal such that each of the input signals has a predetermined frequency which is different from the frequencies of the other input signals; phase shifting at least one of the input signals such that at least one of the input signals has a phase different from the phase of the other input signals; combining all of the input signals to produce a combined signal; and amplifying the combined signal to produce the output signal. In one embodiment all of the input signals are phase shifted relative to one another and in another embodiment all of the input signals are equally phase shifted relative to one another except for one which is of opposite phase. Also all of the input signals are equally spaced in frequency relative to one another or have a common divisor in spacing. The apparatus implements the method of the present invention.

17 Claims, 3 Drawing Sheets

PEAK TO AVERAGE POWER RATIO REDUCTION IN A POWER AMPLIFIER WITH MULTIPLE CARRIER INPUT

BACKGROUND OF THE INVENTION

The present invention relates to a method and apparatus for producing an output signal having a high average power from a plurality of input signals wherein the high average power is achieved due to at least some of the input signals being phase shifted relative to one another.

In the prior art numerous systems and circuits are known for providing a transmittable signal formed from a plurality of carriers having different frequencies, such as tones in a telephone system, for example. One known approach is to use a plurality of transmitters, one for each carrier, which have their inputs connected to a common source having a standard frequency. Each of the transmitters has a different frequency derived from the standard frequency. The outputs of all the transmitters are connected to inputs of a combiner which then feeds an antenna. A disadvantage to this approach is that significant losses occur in the combiner which is typically a passive network. Also the use of multiple transmitters is costly.

Another approach in the prior art is to input all the input signals to one transmitter, however such a transmitter must handle the arithmetical sum of the peak voltages of all the input signals. This results in the use of expensive high power transmitters having a high peak to average power ratio.

The present invention overcomes these drawbacks in the prior art.

SUMMARY OF THE INVENTION

The present invention is a method and apparatus for providing an output signal having a high average power and has the steps of providing a standard frequency; forming a plurality of input signals from the standard signal such that each of the input signals has a predetermined frequency which is different from the frequencies of the other input signals; phase shifting at least one of the input signals such that at least one of the input signals has a phase different from the phase of the other input signals., combining all of the input signals to produce a combined signal; and amplifying the combined signal to produce the output signal. In one embodiment all of the input signals are phase shifted relative to one another and in another embodiment all of the input signals are equally phase shifted relative to one another except for one which is phase shifted 180°. Also all of the input signals are equally spaced in frequency relative to one another or have a common divisor between them, that is, the input frequencies are some multiple of some base or standard frequency.

The device for producing an output signal having a high average power, has in general a means for providing a standard frequency; means for forming a plurality of input signals from the standard signal such that each of the input signals has a predetermined frequency which is different from the frequencies of the other input signals; means for phase shifting at least one of the input signals such that at least one of the input signals has a phase different from the phase of the other input signals; means for combining all of the input signals to produce a combined signal; and means for amplifying the combined signal to produce the output signal. In one embodiment the plurality of input signals are first, second, third and fourth input signals and the frequencies of the input signals are equal to n times a difference frequency added to the standard frequency, respectively, n being an integer. In this embodiment one of the input signals is phase shifted 180° and the other three input signals are phase sifted 0°.

BRIEF DESCRIPTION OF THE DRAWINGS

The features of the present invention, which are believed to be novel, are set forth with particularity in he appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1A:
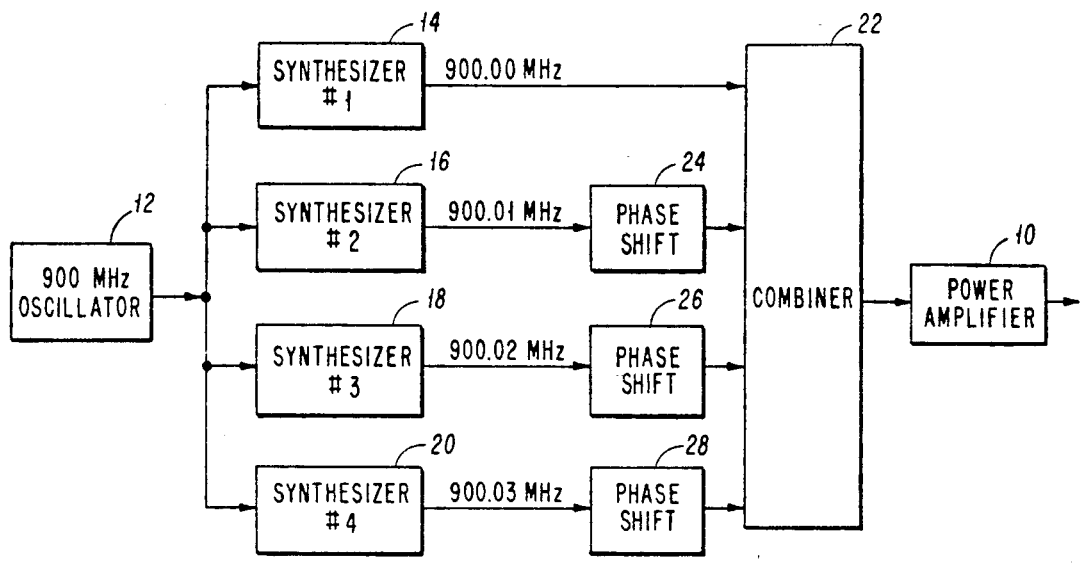
FIG. 1A is a block diagram of one embodiment for implementing the present invention.
Figure 1B:
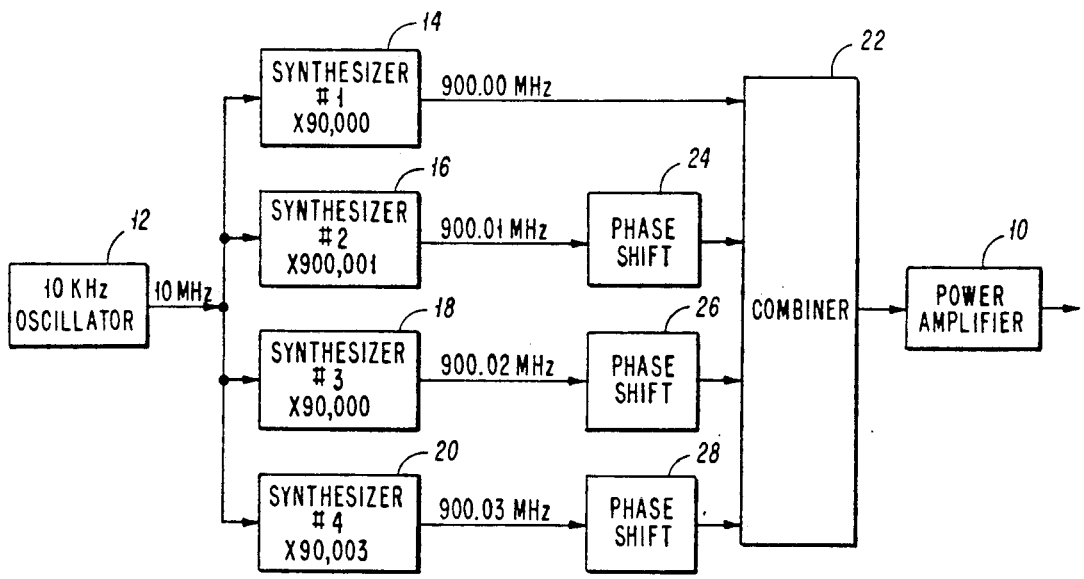
FIG. 1B is a block diagram of another embodiment for implementing the present invention.

The present invention has general applicability, but is most advantageously utilized in systems as shown in FIGS. 1A and 1B. In these embodiments, for example for transmitting tones in a telephone system, a peak to average power ratio reduction is achieved in a power amplifier having multiple carrier inputs.

In the embodiment depicted in FIG. 1A four carriers are combined with proper phasing which results in the reduced peak to average power ratio for the power amplifier 10. An oscillator 12 provides a standard frequency, for example, 900 megahertz, on an output thereof. Although present synthesizers can operate as low as 10 KHz, the 900 MHz range is used to illustrate one embodiment of the present invention. FIG. 1B shows an embodiment using an oscillator 12 operating at 10 KHz. Referring now to FIG. 1A, four frequency synthesizers 14, 16, 18, 20 each have an input connected to the output of the oscillator 12. Each frequency synthesizer produces a carrier having its own frequency. For example, each of the carriers can be 10 kilohertz apart. Also, in the embodiment of FIG. 1A, the first frequency synthesizer 14 has the same frequency as the oscillator 12, although this is not necessary.

Depending upon the application at least one of the signals appearing on outputs of the frequency synthesizers 14, 16, 18, 20 is phase shifted relative to the other signals. As shown in FIG. 1A the first frequency synthesizer is connected directly to an input of a combiner 22, which may be a passive network, thus resulting in a zero phase shift. Phase shifting networks 24, 26, 28 are connected between the second, third and fourth frequency synthesizers 16, 18 and 20, respectively, and inputs of the combiner 22. Actually, it is only necessary for one of the signals input to the combiner to be phase shifted relative to the three other signals, that is, at least one signal must be of opposite phase when the other three signals are in phase.

The output of the combiner 22 is connected to the input of the power amplifier 10. Since the signals input to the combiner 22 are not all in phase at any time, the maximum peak voltage at the input of the power amplifier 10 is never the arithmetical sum of the peak voltages of all of the signals input to the combiner 22. This allows for the use of a less expensive power amplifier having lower peak power capability.

FIG. 1B depicts a preferred embodiment of the present invention wherein the oscillator 12 outputs a frequency of 10 KHz and synthesizers 14, 16, 18 and 20 operate as multipliers, the factors being 90,000; 90,001; 90,002 and 90,003, respectively. The outputs of each of the synthesizers 14, 16, 18 and 20 are phase shifted by phase shifting networks 24, 26 and 28 and combined as before in combiner 22.

Figure 2:
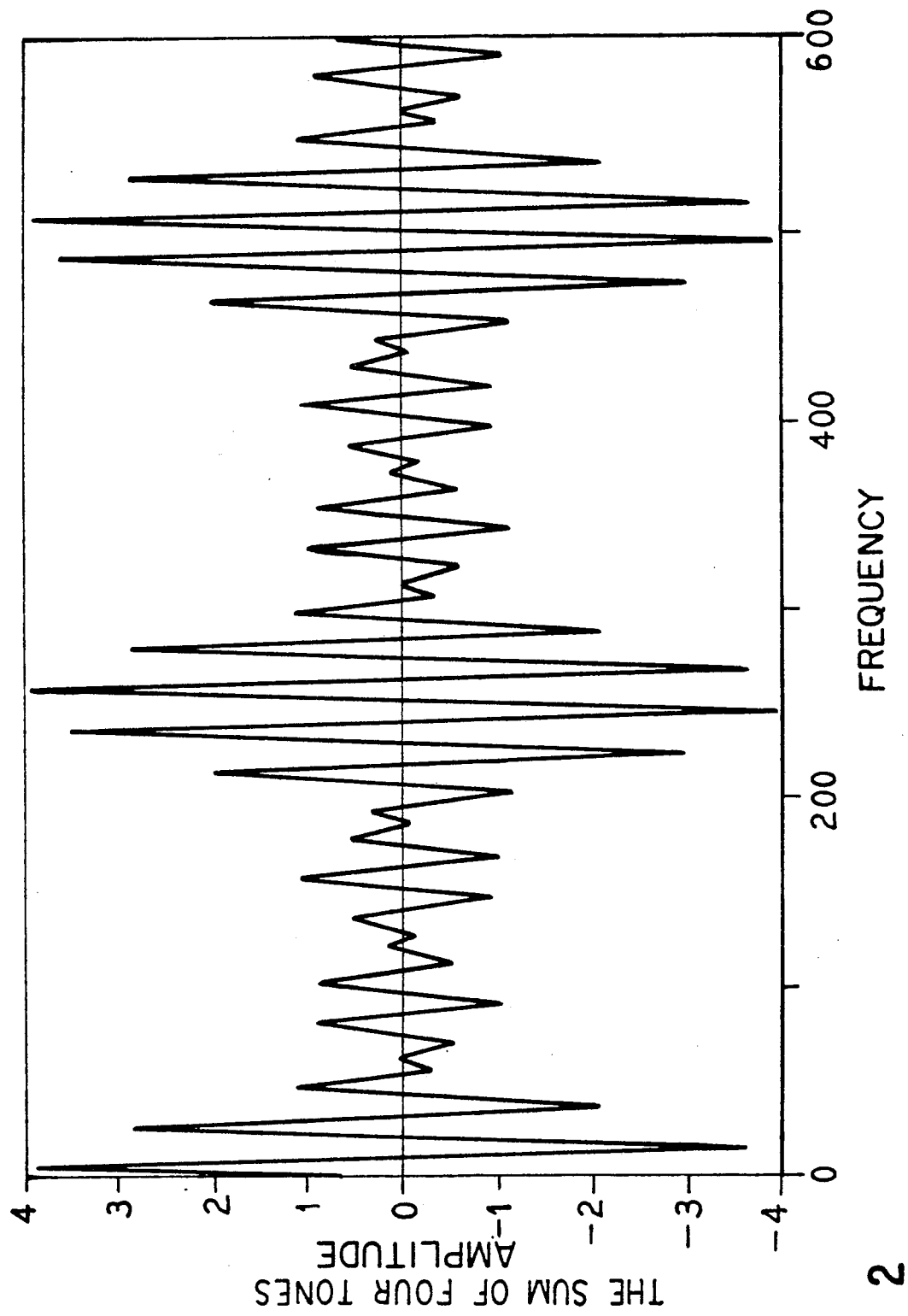
FIG. 2 is a graph combination for four equal amplitude tones or carriers.

FIG. 2 is a graph of the combination for four equal amplitude tones or carriers in the system of either FIG. 1A or FIG. 1B wherein all phase shifts are set to zero. That is, the phase shifts at the summing point are set such that there exists a point in time when all four tones are at zero output and all four tones have either a positive or negative slope at the summing point. It can be seen that there is high peak to average power ratio.

Figure 3:
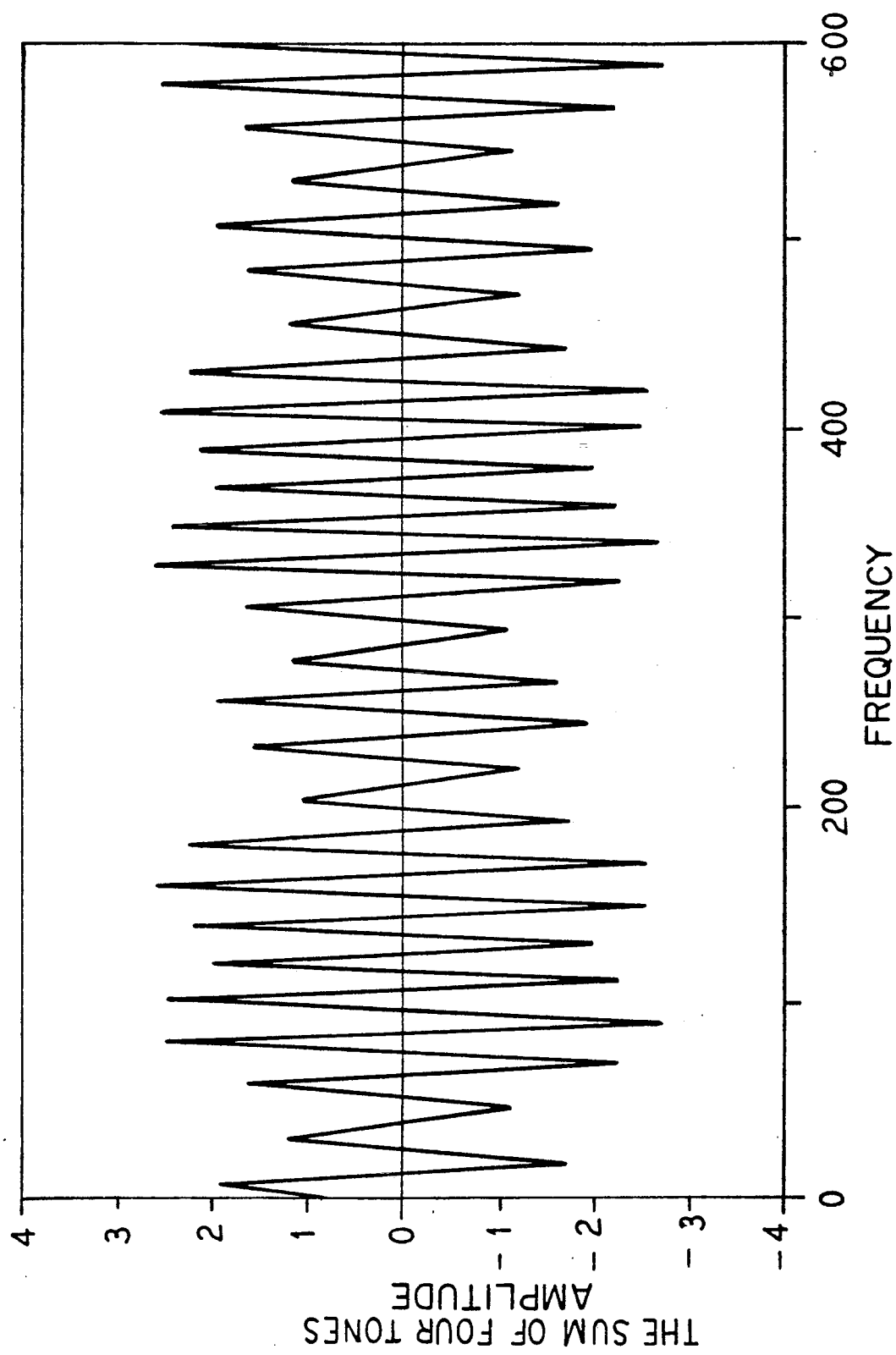
FIG. 3 is a graph of the combination for four tones or carriers being phase shifted according to the present invention.

In contrasts to FIG. 2, FIG. 3 depicts a case wherein the tones or carriers have a phase such that there exists a time when the amplitudes of all of the tones at the summing point are zero and some of the slopes the tones at the summing point are positive and some are negative. For the four equal amplitude carrier case when they are phase shifted such that there exists a time when all of the tones are zero at the summing point and all have slopes of the same sign except for the slope of one of the tones, the ratio of the composite peak voltage to each tone voltage is equal to two times the square root of two or 2.8 for the recommended phasing. This same ratio is 4 for the random four frequency case or for the worst case phasing situation for four carriers when their phasing is such that there exists a time at the summing point when all four tones have zero amplitude and alike sign for all four slopes. The recommended phasing case represents are auction in peak power of two to one.

For the random frequency case or worst case phasing, with four equal input carriers, a 16 watt transmitter will output 4 (one watt per carrier). For the recommended phasing case, with four equal input carriers, the same 16 watt transmitter will output 8 watts.

The term "in-phase" as used herein has a slightly different meaning than the usual meaning. Here, since four different frequencies are used, they cannot be n-phase except periodically. "In-phase" is used to mean that periodically the four frequencies will have equal phase. "In-phase" here then is the phasing condition such that, at the summing point, there exist times when all four tones are at zero and all have either a positive slope or a negative slope at the summing point. This could also be defined as the phasing condition such that, at the summing point, there exist times when all four tones are at their peak amplitudes; all being at either their positive peaks or all being at their negative peaks. A athematical equation is as follows:

Y = Sin(x*60/250) + Sin(x*66/250) + Sin(x*72/250) + Sin(x*78/250)

where x=0 to 600. The graph of this equation is depicted in FIG. 2.

The condition for four tones that produces the lowest peak to average ratio is then, when the phasing is such that, at the summing point, there exist times when all four tones are at zero output and all tones have slope with the same sign except for one tone which has a slope of the opposite sign. This could also be stated as the phasing condition such that, at the summing point, there exist times when all tones are at their positive peak amplitudes except for one being at its negative peak; or, all tones being at their negative peaks except for one being at its positive peak. A mathematical equation is as follows:

Y = Sin(x*60/250) + Sin(x*66/250) + Sin(x*72/250) - Sin(x*78/250)

where x=0 to 600. The graph of this equation is depicted in FIG. 3.

The negative sign on the last term is the 180° phase shift. In terms of modulation, this approach is best for modulations that result in narrow bandwidth of the spectrum. Narrow band frequency modulation or phase modulation would likely be the best choices. However, for a plurality of channels, several channels would likely be unmodulate (voice pauses) if there are several voice channels. Since several measures of channel performance amount to avoiding RF amplifier saturation except for a given number of times per minute, this approach will improve channel performance for narrow band angle modulation systems. That is, for a given power amplifier size, using this method would improve the linearity or distortion measurement of the channel for a given set of inputs.

The generalized four-tone equation with each member being a harmonic of a lower base frequency is:

$$Y = Sin 2N\pi ft + Sin[(N+1)2\pi ft - \theta 1] - Sin[(N+2)2\pi ft + \theta 2] + Sin[(N+3)2\pi ft + \theta 3]$$

By trigonometric identity:

$$Sin\ U + Sin\ V = 2 Sin \frac{U-V}{2} Cos \frac{U-V}{2}, \text{ and } Y =$$

$$2 Sin\left[(2N+1)\pi f + \frac{\theta_1}{2}\right] Cos\left[\pi ft + \frac{\theta_1}{2}\right] +$$

$$2 Sin\left[(2N+5)\pi ft + \frac{\theta_3 - \theta_2}{2}\right] Cos\left[\pi ft + \frac{\theta_3 - \theta_2}{2}\right].$$

Letting 2N = n results in:

$$Cos\left[\pi ft + \frac{\theta_3 - \theta_2}{2}\right]$$

As an Example let n = 20; then:

$$Y = 2 Sin\left[21\pi ft + \frac{\theta_1}{2}\right] Cos\left[\pi ft + \frac{\theta_1}{2}\right] +$$

$$2 Sin\left[25\pi ft + \frac{\theta_3 - \theta_2}{2}\right] Cos\left[\pi ft + \frac{\theta_3 - \theta_2}{2}\right]$$

Note that Cosine terms are modulation terms and are both the same frequency. If these terms were each one, the result would be a two tone pattern of Sin 21πft and Sin 25πft with a peak value of 4. However, if the modulation terms (Cosine terms) can be made not to peak at the same time, the peak of 4 would not be obtainable. The minimum will occur when the Cosine terms are 90° out of phase. (180° will have the same result as in-phase). 90° out of phase will occur when one Cosine argument is zero and the other $\pi/2$. That is:

$$\left(\pi ft + \frac{\theta_1}{2}\right) = 0 \quad \left(\pi ft + \frac{\theta_3 - \theta_2}{2}\right) = \frac{\pi}{2}$$

$$\pi ft = -\frac{\theta_1}{2} \quad -\frac{\theta_1}{2} + \frac{\theta_3 - \theta_2}{2} = \frac{\pi}{2}$$

and let $\theta_1 = \theta_2 = 0$, so that $\theta_3 = \pi$

So one term of the four terms of the equation for a four tone composite signal must be of opposite phase when the other three are in phase. The result is that a peak of $2\sqrt{2}$ times the level of one tone occurs rather than a peak of 4.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

I claim:

1. A method for producing an output signal having a high average power, the method comprising the steps of:
   providing a standard frequency signal;
   forming a plurality of input signals from said standard frequency signal such that each of said input signals has a predetermined frequency which is different from the frequencies of the other input signals;
   phase shifting at least one of said input signals such that at least one of said input signals has a phase different from the phase of the other input signals;
   combining all of the input signals to produce a combined signal; and
   amplifying said combined signal to produce said output signal.

2. The method according to claim 1, wherein all of said input signals are phase shifted relative to one another.

3. The method according to claim 1, wherein all of said input signals are equally phase shifted relative to one another.

4. The method according to claim 1, wherein all of said input signals are equally spaced in frequency relative to one another.

5. A method for producing an output signal having a high average power, the method comprising the steps of:
   providing a standard frequency signal;
   forming at least four input signals from said standard frequency signal such that at least three of said input signals has a predetermined frequency which is different from the frequencies of the other input signals;
   phase shifting at least one of said input signals such that one of said input signals is of an opposite phase when the other three input signals are in phase;
   combining all of the input signals to produce a combined signal; and
   amplifying said combined signal to produce said output signal.

6. The method according to claim 5, wherein said four input signals are first, second, third and fourth input signals and wherein the frequencies of the input signals is equal to k times a difference frequency added to said standard frequency, respectively, k being an integer.

7. The method according to claim 6, wherein k is an integer in the set 0, 1, 2, 3.

8. The method according to claim 6, wherein said one of said input signals is phase shifted 180 degrees and the other three input signals are phase shifted 0 degrees.

9. A device for producing an output signal having a high average power, comprising:
   means for providing a standard frequency signal;
   means for forming a plurality of input signals from said standard frequency signal such that each of said input signals has a predetermined frequency which is different from the frequencies of the other input signals;
   means for phase shifting at least one of said input signals such the at least one of said input signals has a phase different from the phase of the other input signals;
   means for combining all of the input signals to produce a combined signal; and
   means for amplifying said combined signal to produce said output signal.

10. The device according to claim 9, wherein said means for providing a standard frequency is an oscillator providing said standard frequency on an output thereof.

11. The device according to claim 10, wherein said means for forming a plurality of input signals is a plurality of frequency synthesizers having inputs connected to said output of said oscillator and providing said input signals on outputs thereof, respectively.

12. The device according to claim 11, wherein said means for phase shifting is a plurality of phase shift networks each having an input and an output, an input of each phase sift network connecting to a respective output of said frequency synthesizers.

13. The device according to claim 12, wherein said means for combining is a passive network having a plurality of inputs connected to said outputs of said phase shift networks, respectively, and providing said combined signal on an output thereof.

14. The device according to claim 13, wherein said means for amplifying is a power amplifier.

15. The device according to claim 9, wherein said plurality of input signals are first, second, third and fourth input signals and wherein the frequencies of the input signals are equal to k times a difference frequency added to said standard frequency, respectively, n being an integer.

16. The device according to claim 15, wherein k is an integer in the set 0, 1, 2, 3.

17. The method according to claim 16, wherein said one of said input signals is phase shifted 180 degrees and the other three input signals are phase shifted 0 degrees.

* * * * *